(12) United States Patent
Kawasaki et al.

(10) Patent No.: US 7,064,346 B2
(45) Date of Patent: Jun. 20, 2006

(54) TRANSISTOR AND SEMICONDUCTOR DEVICE

(75) Inventors: Masashi Kawasaki, Sagamihara (JP); Hideo Ohno, Sendai (JP)

(73) Assignee: Japan Science and Technology Agency, Saitama (JP)

( * ) Notice: Subject to any disclaimer, the term of this patent is extended or adjusted under 35 U.S.C. 154(b) by 93 days.

(21) Appl. No.: 10/765,901

(22) Filed: Jan. 29, 2004

(65) Prior Publication Data
US 2005/0127380 A1    Jun. 16, 2005

Related U.S. Application Data

(62) Division of application No. 09/850,732, filed as application No. PCT/JP99/06300 on Nov. 11, 1999, now Pat. No. 6,727,522.

(30) Foreign Application Priority Data

Nov. 17, 1998    (JP)    ................. 10-326889

(51) Int. Cl.
*H01L 29/10*    (2006.01)

(52) U.S. Cl. .............. 257/43; 257/613; 257/614; 257/192; 257/197; 257/E29.094; 257/E29.099

(58) Field of Classification Search ........... 257/43, 257/613, E29.079, E29.094, E29.099, E29.296, 257/E21.698, E21.699
See application file for complete search history.

(56) References Cited

U.S. PATENT DOCUMENTS

| 4,233,573 A | 11/1980 | Grudkowski |
| 4,582,395 A | 4/1986 | Morozumi |

(Continued)

FOREIGN PATENT DOCUMENTS

| JP | 56-125868 | 10/1981 |
| JP | 57-132191 | 8/1982 |

(Continued)

OTHER PUBLICATIONS

A.Onodera, et al., "Ferroelctric Properties in Piezoelectric Semiconductor Zn1 -xMxO (M=Li, Mg)", Jpn. J. Appl. Phys., vol. 36, Part 1, No. 9B, pp. 6008-6011, Sep. 1997.

(Continued)

*Primary Examiner*—Kenneth Parker
*Assistant Examiner*—José R. Díz
(74) *Attorney, Agent, or Firm*—Niefeld IP Law, PC

(57) ABSTRACT

In an npn-type transistor, the emitter 42 and the collector 43 are formed of an n-type transparent semiconductor, and the base 41 is formed by a p-type transparent semiconductor. The base electrode 44, the emitter electrode 45 and the collector electrode 46 are formed respectively on the base 41, the emitter 42 and the collector 43. As the n-type transparent semiconductor, for example, n-type ZnO is used. The n-type ZnO is ZnO doped with, for example, group III elements, group VII elements. As the p-type transparent semiconductor, for example, p-type ZnO is used. The p-type ZnO is ZnO doped with, for example, group I elements and group V elements.

24 Claims, 9 Drawing Sheets

U.S. PATENT DOCUMENTS

| | | |
|---|---|---|
| 5,532,062 A | 7/1996 | Miyazaki et al. |
| 5,625,199 A | 4/1997 | Baumbach et al. |
| 5,744,864 A | 4/1998 | Cillessen et al. |
| 6,410,162 B1 | 6/2002 | White et al. |
| 6,878,962 B1 * | 4/2005 | Kawasaki et al. ............ 257/43 |

FOREIGN PATENT DOCUMENTS

| | | |
|---|---|---|
| JP | 63-121886 | 5/1988 |
| JP | 01-065868 | 3/1989 |
| JP | 07-114351 | 5/1995 |
| JP | 9-199732 | 7/1997 |

OTHER PUBLICATIONS

A. Onodera, et al., "Dielectric Activity and Ferroelectricity in Piezoelectric Semiconductor Li-DoppedZnO", Jpn. J. Appl. Phys., vol. 35, Part 1, No. 9B, pp. 65160-65162, Sep. 1996.

Boesen, et al., "ZnO Field-Effect Transistor", Proceedings of the IEEE, pp. 2094-2095, Nov. 1968.

* cited by examiner (A)

(B)

(A)

(B)

(A)

(B)

(A)

(B)

(A)

(B)

TRANSISTOR AND SEMICONDUCTOR DEVICE

This application is a divisional of U.S. patent application Ser. No. 09/850,732, filed Jun. 6, 2001, now U.S. Pat. No. 6,727,522, which is a U.S. national stage application of international application PCT/JP99/06300 filed Nov. 11, 1999, which claims the benefit of Japanese application 10-326889, filed Nov. 17, 1998.

The disclosure of application Ser. No. 09/850,732 is incorporated herewith by reference.

FIELD OF THE INVENTION

The present invention relates to a transistor and a semiconductor device, more particularly to a transparent transistor, a semiconductor device having the transparent transistor stacked thereon, and a semiconductor device to which the transparent transistor is applied for driving a light emission device, for reading/writing data from/to a memory, and for other purposes. It should be noted that in the present invention, a concept of "transparent" includes a concept of "being transparent or offering light transmission property" for the sake of simplifying descriptions.

DESCRIPTIONS OF THE RELATED ARTS

A thin film transistor using amorphous silicon, polycrystalline silicon or the like has been generally used as a transistor for use in driving liquid crystal display devices. Since these materials exhibit photosensitivity for the visible light region, carriers are generated by a beam of light, and resistivity of a thin film constituting the thin film transistor is lowered. For this reason, when the beam of light is radiated thereonto, the transistor may be made to be a turn-on state, in spite of the fact that the transistor must be controlled to be a turn-off state. Accordingly, to keep the transistor at the turn-on state, the lowering of the carrier resistivity of the thin film due to the radiation of the beam of light has been heretofore prevented by the use of a light shielding layer made of a metal film or the like.

DISCLOSURE OF THE INVENTION

Generally, the liquid crystal display device has been widely used for a notebook type personal computer or the like, and an energy-saving measure, a high luminance and a miniaturization have been requested of the liquid crystal display device. To reply to these requests, it is effective to increase a rate of an effective area of a display portion within a unit pixel. However, since a light shielding layer made of a metal thin film or the like in the transistor for driving the liquid crystal display device is formed as described above, a rate of an area of a light transmission portion to that of the light shielding layer (opening ratio) in the pixel reduces. Accordingly, a reduction of a transistor area by improving a performance of the transistor or an improvement of luminance of a backlight are necessary to develop a display device having high luminance. However, the measure to improve the characteristic of the transistor shows a limitation to a yield, leading to an increase in cost. Moreover, the measure to improve the luminance of the backlight increases an amount of energy consumption.

From the viewpoint of the above described points, the object of the present invention is to provide a transistor using a transparent channel layer made of zinc oxide or the like, which is transparent partially or entirely, because an orientation control of the zinc oxide and a valence electron control thereof that has been heretofore difficult is now possible. Specifically, the object of the present invention is to provide a transistor which uses a transparent material such as the zinc oxide or the like for a channel layer (conductive layer) so that the channel layer does not have a photosensitivity for the visible light region, and removes a necessity to form a light shielding layer, thus increasing an area rate of a display portion of a liquid crystal display device or the like.

Furthermore, the object of the present invention is to use a transparent transistor for various kinds of applications in an optical device field for use in driving a light emission device such as a plane light emission laser and an electroluminescence device and for use in a memory. Still furthermore, the object of the present invention is to provide a semiconductor device used as a transparent electronic device for various kinds of wide applications in addition to a driving circuit requiring no light shielding layer.

According to first solving means of the present invention, a transistor is provided, which comprises:

a transparent channel layer using any one of zinc oxide ZnO, zinc magnesium oxide $Mg_xZn_{1-x}O$, zinc cadmium oxide $Cd_xZn_{1-x}O$ and cadmium oxide CdO; and a source, a drain and a gate in which a transparent conductive material such as conductive ZnO doped or undoped with any one of group III elements, group VII elements, group I elements and group V elements, a transparent conductive material such as $In_2O_3$, $SnO_2$ and $(In-Sn)O_x$, or an untransparent electrode material are used partially or entirely.

According to second solving means of the present invention, a transistor is provided, which comprises:

an emitter and a collector, or a base which are made of a transparent n-type semiconductor such as ZnO doped with group III elements or group VII elements;

a base, or an emitter and a collector which are made of a transparent p-type semiconductor such as ZnO doped with group I element or group V elements; and a base electrode, an emitter electrode and a collector electrode respectively formed on the base, the emitter and the collector, in which a transparent conductive material such as conductive ZnO doped or undoped with any one of group III elements, group VII elements, group I elements and group V elements, a transparent conductive material such as $InO_3$, $SnO_2$ and $(In-Sn)O_x$, or an untransparent electrode material are used partially or entirely.

Still another object of the present invention is to provide a semiconductor device in which a transparent transistor is stacked, and a semiconductor device applied to a light emission device, a memory or the like.

BRIEF DESCRIPTIONS OF THE DRAWINGS

FIGS. 1(A) and 1(B) are section views of a first embodiment of a transistor according to the present invention.

FIGS. 2(A) and 2(B) are section views of second and third embodiments of a transistor according to the present invention.

Figure 6:
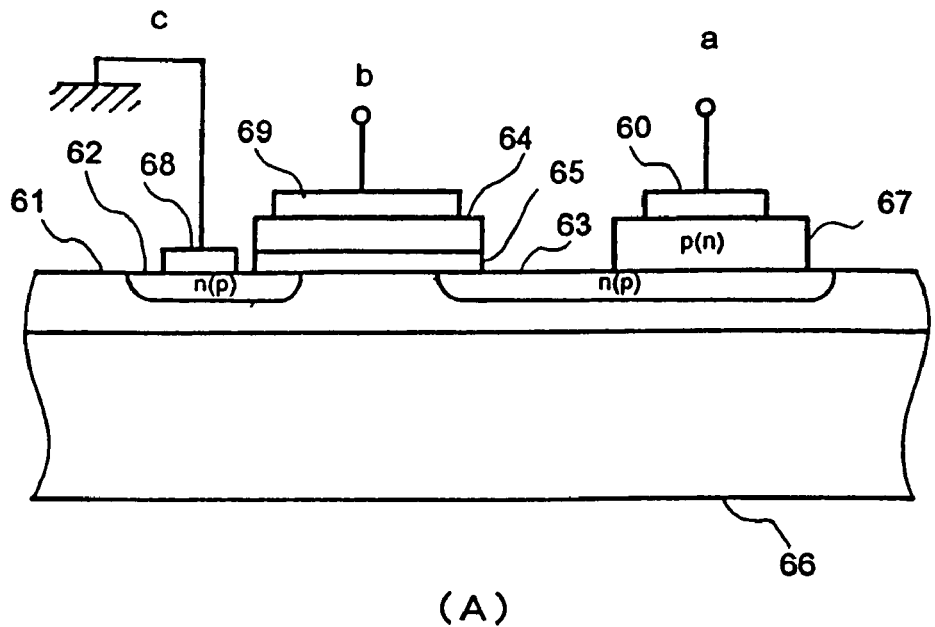
Figure 6:
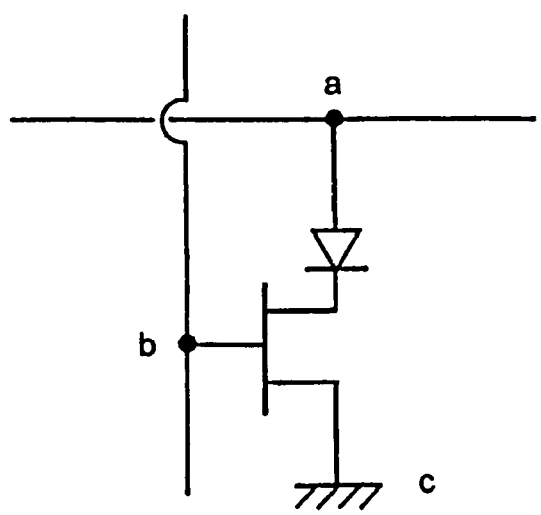

FIGS. 6(A) and 6(B) are a section view and a circuit diagram of a semiconductor device to which a FET according to the present invention is applied for driving a light emission device.

Figure 7:
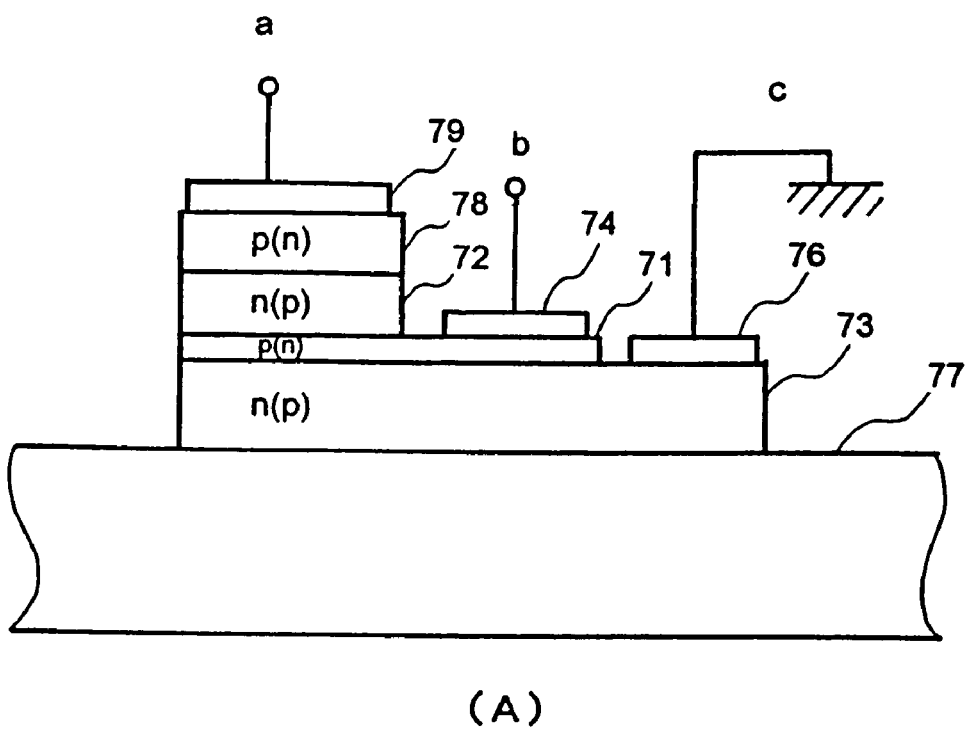
Figure 7:
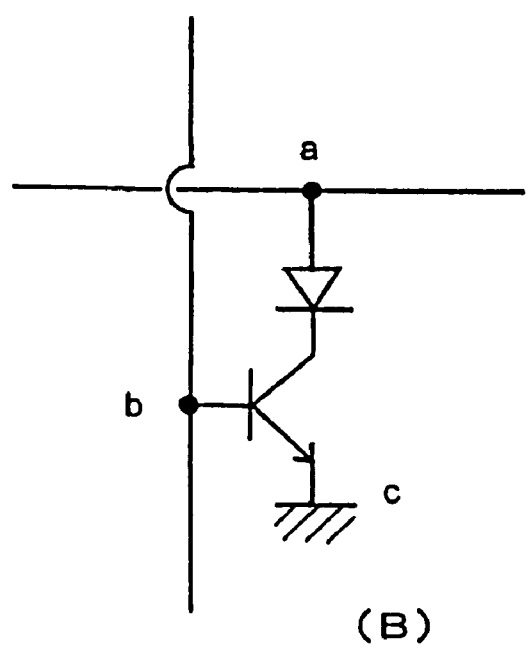

FIGS. 7(A) and 7(B) are a section view and a circuit diagram of a semiconductor device to which a bipolar transistor according to the present invention is applied for driving a light emission device.

Figure 8:
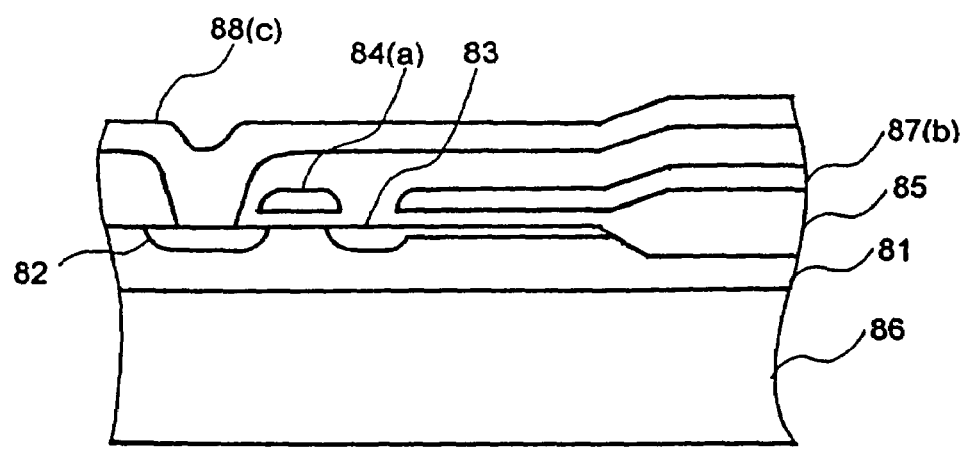
Figure 8:
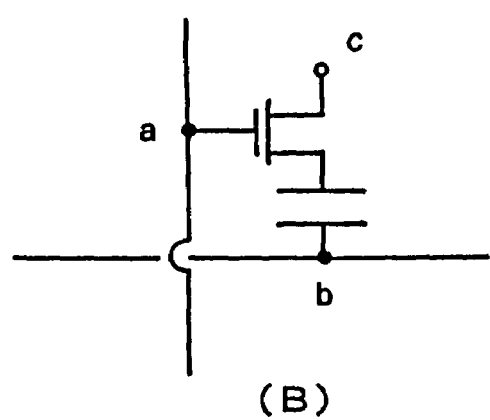

FIGS. 8(A) and 8(B) are a section view and a circuit diagram of a device to which the FET according to the present invention is applied for controlling a memory device.

Figure 9:
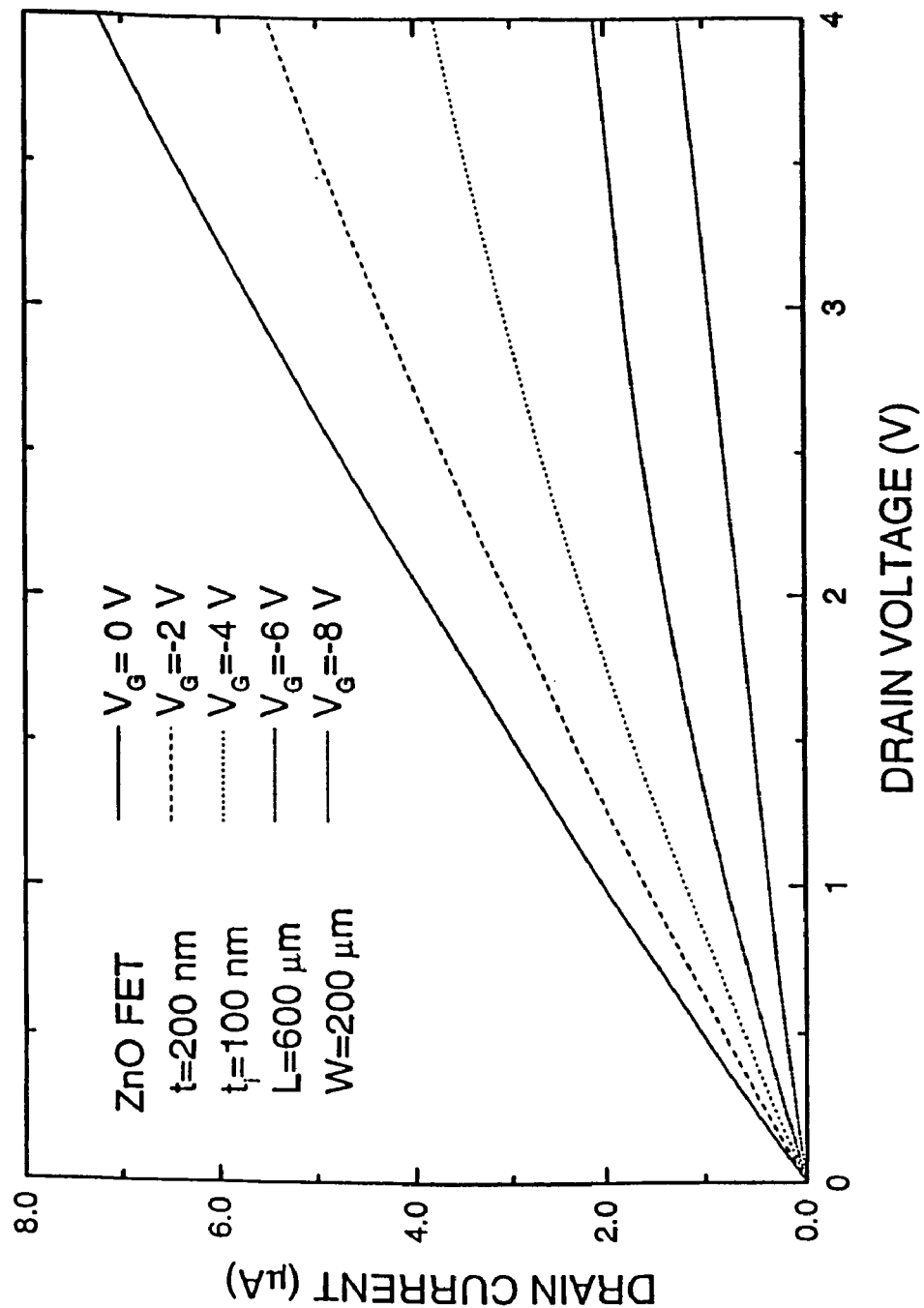

FIG. 9 is a characteristic view of a transistor of the present invention.

PREFERABLE EMBODIMENTS OF THE INVENTION (1) Field Effect Transistor (FET)

Figure 1:
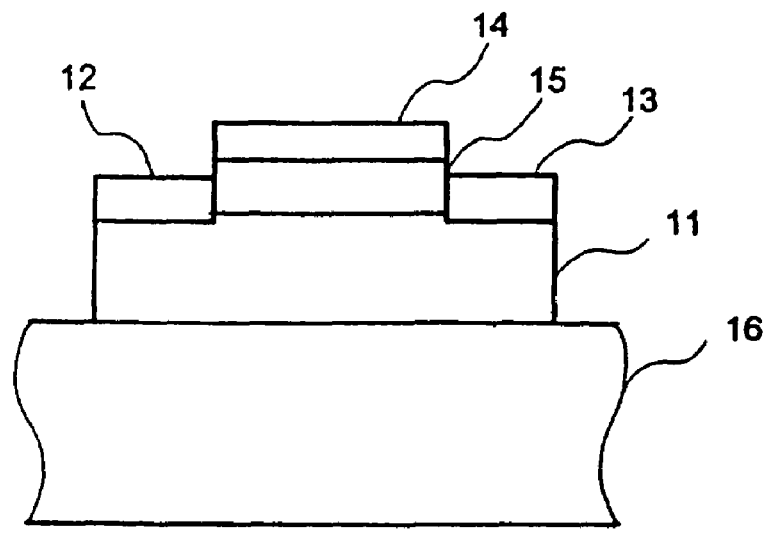
Figure 1:
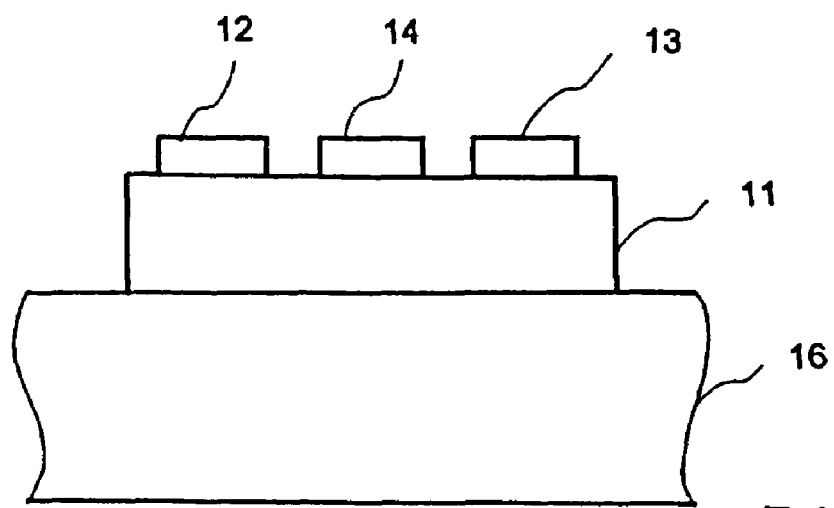

A section view of a first embodiment of a transistor according to the present invention is shown in FIGS. 1(A) and 1(B). As shown in FIG. 1(A), the transistor of the first embodiment relates to a FET, and comprises a channel layer 11, a source 12, a drain 13, a gate 14, a gate insulating layer 15 and a substrate 16. The channel layer 11 is formed on the substrate 16. On the channel layer 11, formed are the gate insulating layer 15, the source 12 and the drain 13. The gate 14 is formed on the gate insulating layer 15.

A modification of a first embodiment is shown in FIG. 1(B). In this transistor, the channel layer 11 is formed on the substrate 16. Furthermore, on the channel layer 11, the source 12 and the drain 13 are formed by an ohmic junction, and the gate 14 is formed thereon by a Shottky junction. In this embodiment, since the transistor lacks the gate insulating layer 15 unlike that of FIG. 1(A), a proper gap is provided between the gate 14 and the source 12 and between the gate 14 and the drain 13.

Materials of the respective constituent components will be described below.

Firstly, the channel layer 11 is formed of a transparent semiconductor. As the material of the transparent channel layer 11, any of zinc oxide ZnO, zinc magnesium oxide $Mg_xZn_{1-x}O$ zinc cadmium oxide $Cd_xZn_{1-x}O$, cadmium oxide CdO or the like can be used. Either a material doped with n and p-type impurities or a material undoped with them may be used.

Secondly, a transparent electrode is used either for all of the source 12, the drain 13 and the gate 14 or for any of them. As the transparent electrode, a transparent conductive material such as conductive ZnO is used, which is doped with any one of group III elements (B, Al, Ga, In, Tl), group VII elements (F, Cl, Br, I), group I elements (Li, Na, K, Rb, Cs) and group V elements (N, P, As, Sb, Bi) or undoped with them. Herein, when these elements are doped, a doping amount can be set properly. For example, though $n^{++}$-ZnO doped with n-type elements at a high concentration can be used, elements to be doped are not limited to this. Moreover, as the source 12, the drain 13 and the gate 14, transparent conductive materials such as $In_2O_3$, $SnO_2$ and $(In-Sn)O_x$ can be used in addition to these. Besides these transparent materials, metals such as Al and Cu and electrode materials such as highly doped semiconductor polysilicon which is untransparent may be used. Moreover, it is possible to adopt a transparent material and a non-transparent material together.

Thirdly, as the gate insulating layer 15, a transparent insulating material such as insulative ZnO doped with an element which can take a valence of 1 as a valence number or doped with group V element is used. As the element which can take the valence of 1, for example, group I elements (Li, Na, K, Rb, Cs), Cu, Ag, Au or the like are enumerated. As the group V element, N, P, As, Sb, Bi or the like are enumerated. As the gate insulating layer 15, in addition to these materials, a transparent insulative oxide material such as $Al_2O_3$, MgO, $CeO_2$, $ScAlMgO_4$ and $SiO_2$ can be used. Furthermore, a transparent insulator such as vinyl and plastic may be used. It should be noted that the gate insulating layer 15 is preferably made of a high insulative material offering a good lattice matching with the material of the channel layer 11. If the channel layer 11 is made of zinc oxide, for example, $ScAlMgO_4$ or the like are used. These materials are in conformity with each other in their lattice constants in all planes thereof within 1%, and these materials can be epitaxilly grown mutually. Moreover, by using a high dielectric material for the gate insulating layer 15, it is also possible to allow the transistor itself to possess a memory function. As the high dielectric material, for example, $Zn_{1-x}Li_xO$, $Zn_{1-x}(Li_yMg_{x-y})O$ or the like can be used.

Fourthly, as the substrate 16, insulative materials are mainly used. When it is intended that the substrate is made to be transparent, for example, glass, sapphire, plastic or the like can be used as a transparent material. Furthermore, materials that are untransparent may be used as the substrate depending on purposes. For example, for the purposes in which transparency is required as a liquid crystal display screen or the like, a transparent substrate should be used. When a zinc oxide single crystal or a $ScAlMgO_4$ single crystal as one of materials having the most excellent property is used for the substrate 16, the transparent channel layer 11, or the source 12 and the drain 13 can be grown epitaxially on the substrate. Although some grain boundaries exist on the substrate made of a sapphire single crystal, it is possible to grow the channel layer 11 or the like epitaxially. Moreover, by using the glass substrate, though an in-plane orientation is random, it is possible to control the orientation in a thickness direction as c-axis, and the transistor of this embodiment can show sufficient characteristics as a driving circuit of a display device.

Figure 2:
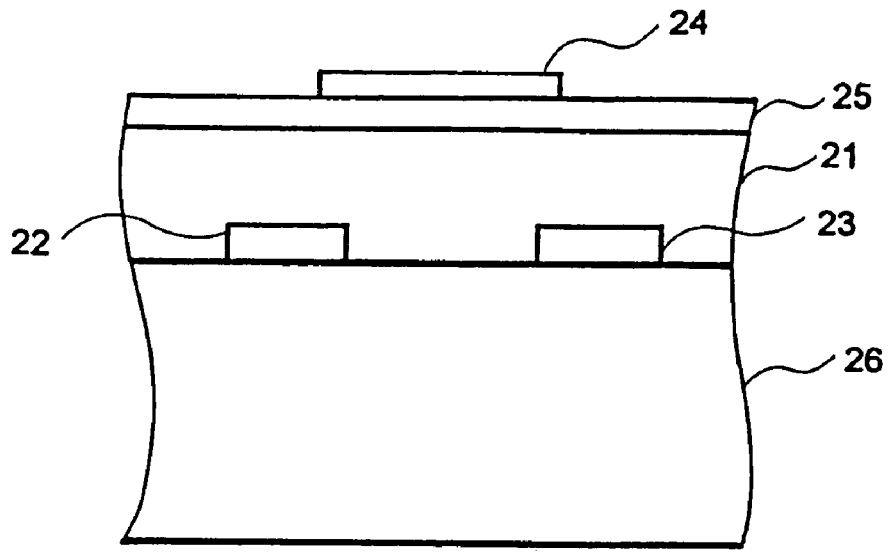
Figure 2:
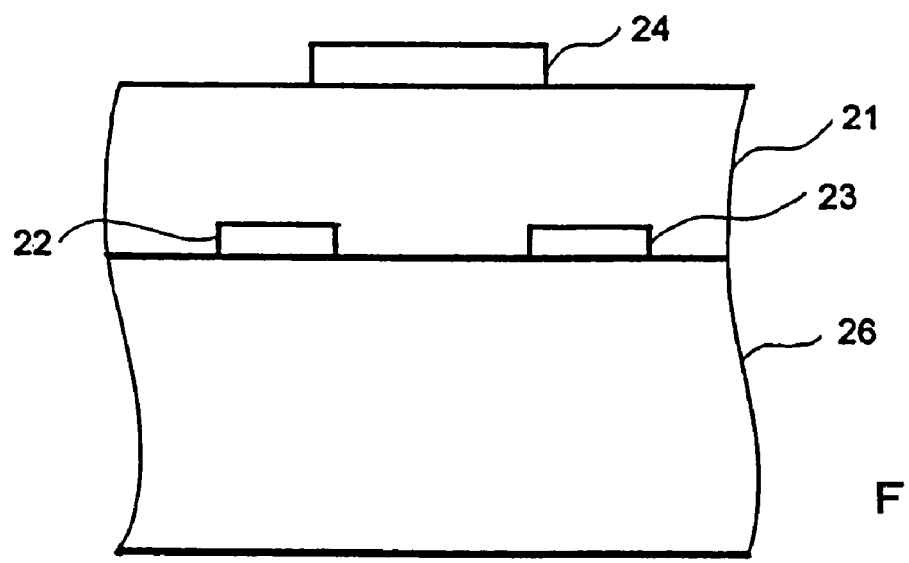

In FIGS. 2(A) and 2(B), section views of second and third embodiments of a transistor according to the present invention are shown. The transistor of the second embodiment shown in FIG. 2(A) relates to a FET, and comprises a channel layer 21, a source 22, a drain 23, a gate 24, a gate insulating layer 25 and a substrate 26. The source 22 and the drain 23 are formed on the substrate 26. The channel layer 21 is formed so as to cover the substrate 26, the source 22 and the drain 23. The gate insulating layer 25 is formed on the channel layer 21. The gate 24 is formed on the gate insulating layer 25. Herein, the gate 24, the gate insulating layer 25 and the channel layer 21 constitute a MIS structure.

A section view of the third embodiment of the transistor according to the present invention is shown FIG. 2(B). This transistor is a modification of the second embodiment. In the transistor shown in FIG. 2(B), the gate insulating layer 25 is not formed unlike the transistor shown in FIG. 2(A), and the gate 24 and the channel layer 21 constitutes a Shottky junction structure. When the gate insulating layer 25 is provided like the transistor shown in FIG. 2(A), a limitation to a voltage applied to the gate is small. Contrary to this, when the gate insulating layer 25 is not provided like the transistor shown in FIG. 2(B), withstand voltages between the gate and the source and between the gate and the drain become low. In this case, manufacturing processes are simplified.

Figure 3:
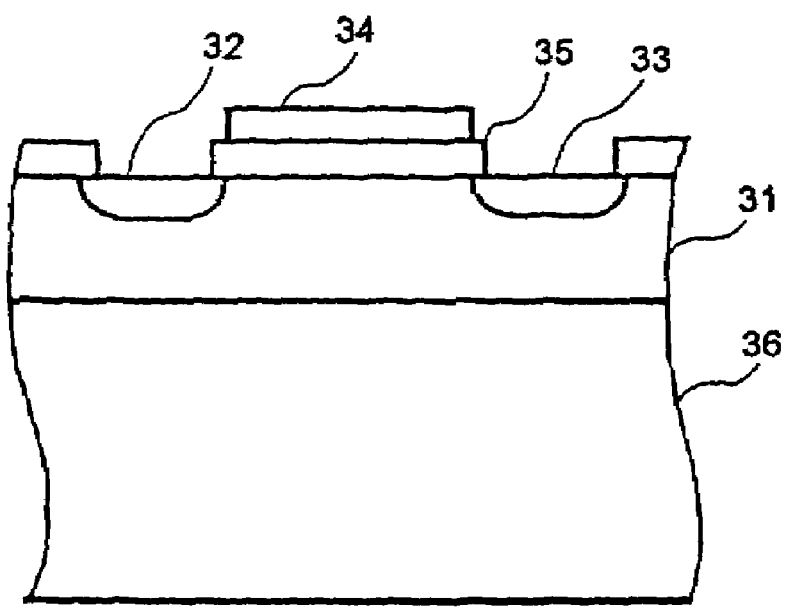
FIG. 3 is a section view of a fourth embodiment of a transistor according to the present invention.

A section view of a fourth embodiment of a transistor according to the present invention is shown in FIG. 3. The transistor of the fourth embodiment relates to a FET, and comprises a channel layer 31, a source 32, a drain 33, a gate 34, a gate insulating layer 35 and a substrate 36. The channel layer 31 is formed on the substrate 36. The gate insulating layer 35 is formed on the channel layer 31, and the gate 34 is formed on the gate insulating layer 35. The source 32 and the drain 33 can be formed by diffusing or ion-implanting impurities thereinto using the gate insulating layer 35 as a mask. Moreover, as a modification of this embodiment, the gate insulating layer 35 can be omitted by appropriately setting a size of the gate 34 to a certain scale.

It should be noted that in the foregoing second to fourth embodiments, materials of the constituent components are the same as those described in the first embodiment.

(2) Bipolar Transistor

Figure 4:
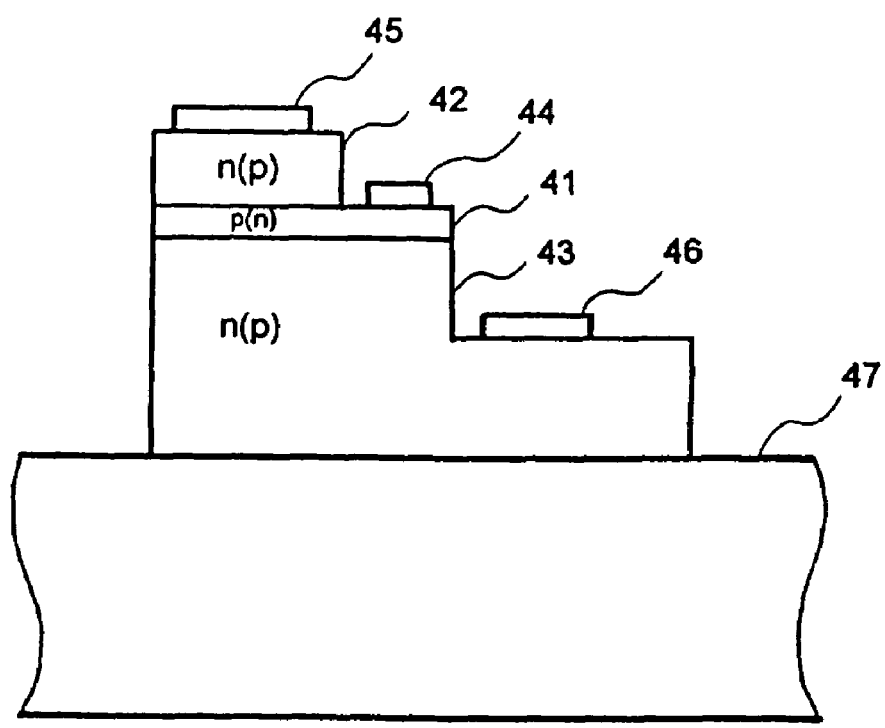
FIG. 4 is a section view of a fifth embodiment of a transistor according to the present invention.

A section view of a fifth embodiment of a transistor according to the present invention is shown in FIG. 4. The transistor of the fifth embodiment relates to a bipolar transistor, and comprises a base 41, an emitter 42, a collector 43, a base electrode 44, an emitter electrode 45, a collector electrode 46 and a substrate 47.

In an npn-type transistor, the emitter 42 and the collector 43 are formed of an n-type transparent semiconductor, and the base 41 is formed by a p-type transparent semiconductor. The base electrode 44, the emitter electrode 45 and the collector electrode 46 are formed respectively on the base 41, the emitter 42 and the collector 43. Similarly, in a pnp-type transistor, the emitter 42 and the collector 43 are formed of a p-type semiconductor as shown in parentheses, and the base 41 is formed of an n-type transparent semiconductor. Since the bipolar transistor can allow a large current to flow therethrough compared to the FET, the bipolar transistor is particularly advantageous when a large current is required for driving a laser or the like.

The materials of the constituent components will be described below.

As the n-type transparent semiconductor, for example, n-type ZnO is used. The n-type ZnO is ZnO doped with, for example, group III elements (B, Al, Ga, In, Tl), group VII elements (F, Cl, Br, I). As the p-type transparent semiconductor, for example, p-type ZnO is used. The p-type ZnO is ZnO doped with, for example, group I elements (Li, Na, K, Rb, Cs) and group V elements (N, P, As, Sb, Bi). A doping amount can be set to a proper value depending on a dimension of the device, a thickness thereof, an integration degree thereof and performance thereof.

Materials of the base electrode 44, the emitter electrode 45, and the collector electrode 46 are the same as those of the source 12, the drain 13 and the gate 14 described in the first embodiment. Specifically, as the transparent electrode, a transparent conductive material such as conductive ZnO doped with any one of group III elements (B, Al, Ga, In, Ti), group VII elements (F, Cl, Br, I), and group I elements (Li, Na, K, Rb, Cs) or conductive ZnO undoped with these materials is used. Herein, when these elements are doped, it is possible to set a doping amount to a proper value. Although $n^{++}$-ZnO or the like, which are doped with n-type elements with a high concentration, can be used, the doping amount is not limited to this. Moreover, as the base electrode 44, the emitter electrode 45 and the collector electrode 46, a transparent conductive material such as $In_2O_3$, $SnO_2$ and $(In-Sn)O_x$ can be used in addition to the above described materials. Besides the transparent materials, a metal such as Al and Cu and an untransparent electrode material such as highly doped semiconductor polysilicon may be used. Moreover, transparent or untransparent materials are properly selected and used for all of the electrodes or a part of them.

(3) Stacked Type Semiconductor Device

Figure 5:
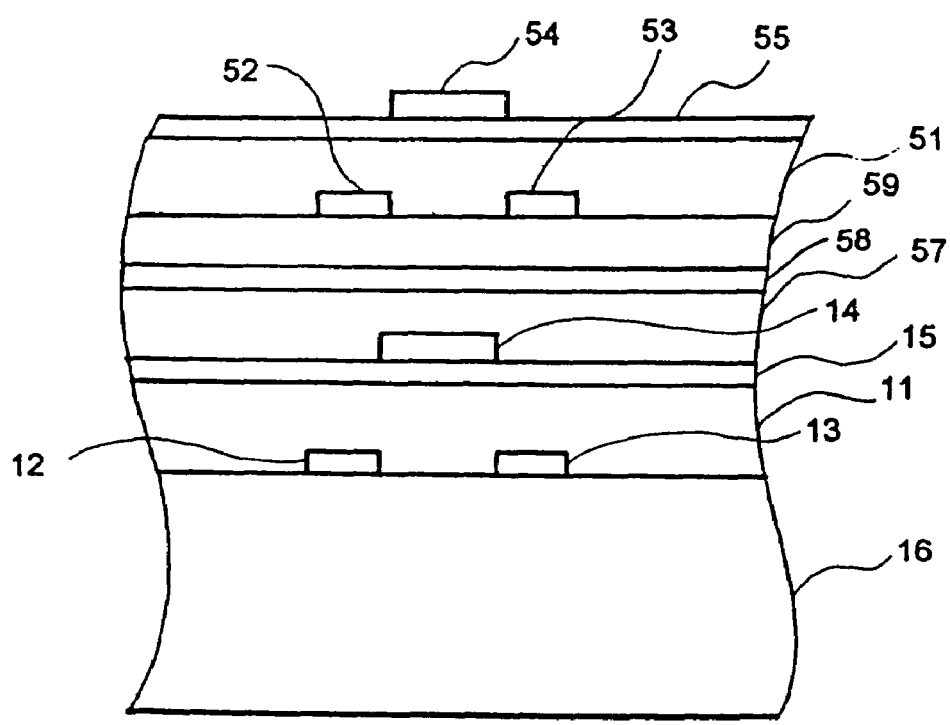
FIG. 5 is a section view of a stacked type semiconductor device.

A section view of a stacked type semiconductor device is shown in FIG. 5. FIG. 5 shows, as an example, a case where the transistors of the first embodiment are stacked. Specifically, a second transistor is further formed on a transistor which comprises a channel layer 11, a source 12, a drain 13, a gate 14, a gate insulating layer 15 and a substrate 16. At this time, an insulating layer 57 and a conductive shielding layer 58 are formed between the first and second transistors. The conductive shielding layer 58 serves to electrically shield the first and second transistors from one another. As the second transistor, an insulating layer 59 serving as a substrate is formed, and a second source 52 and a second drain 53 are formed thereon. Moreover, a second channel layer 51 is formed so as to cover the insulating layer 59, the second source 52 and the second drain 53, and a second gate insulating layer 55 and a second gate 54 are formed thereon.

Materials of the insulating layers 57 and 59 may be the same as that of the gate insulating layer 15, and another insulating material identical to that of the transparent substrate 16 may be used. As a material of the conductive shielding layer 58, the same material as that of the source 12, the drain 13 and the gate 14 can be used. By forming the insulating layer 57 or 59 so as to have a thickness larger than that of either the channel layer 11 or the channel layer 11 and the gate insulating layer 15, the conductive shielding layer 58 and the insulating layer 57 or 59 can be omitted.

When the transistors are stacked upon another, the channel layer 11, the second channel layer 51 or the insulating layer 57 is preferably flattened suitably according to demand. Note that since there is a possibility of increasing cost by adding flattening processes, any of these layers may be flattened properly. Furthermore, as to the number of the stacked transistors, the suitable number of the transistors can be stacked according to demand. Furthermore, the transistors of the foregoing first to fifth embodiments are suitably selected and can be stacked. Still furthermore, the plural kinds of transistors may be selected to be stacked mixedly upon another.

(4) Application to Light Emission Device

A section view and a circuit diagram of a semiconductor device to which the FET according to the present invention is applied for driving a light emission device are shown in FIGS. 6(A) and 6(B). Reference symbols a, b and c in the section view of FIG. 6(A) correspond to reference symbols a, b and c in the circuit diagram of FIG. 6(B). In this device, a transistor is formed of a channel layer 61, a source 62, a drain 63, a gate 64, a gate insulating layer 65 and a substrate 66. A semiconductor layer 67 is formed on the region of the drain 63, whereby the drain 63 and the semiconductor layer 67 form a light emission portion. Moreover, a source electrode 68, a gate electrode 69 and a light emission portion electrode 60 are provided in this device. As to the light emission portion, when an n-type semiconductor is used for the drain 63, a p-type semiconductor is used for the semiconductor layer 67. On the other hand, when a p-type semiconductor is used for the drain 63, an n-type semiconductor is used for the semiconductor layer 67.

A transparent semiconductor material identical to that of the gate 64 is used for the semiconductor layer 67, and a transparent electrode material is used for the light emission portion electrode 60. Thus, the light emission portion of this device is enabled to perform a plane light emission in the upward direction in FIG. 6(A). Furthermore, by using a transparent material for the substrate 66, the light emission portion thereof is enables to perform the plane light emission in the downward direction in FIG. 6(A). In addition, if a light emission zone is equal to an ultraviolet zone, a light emitted from the light emission portion can be converted into a visible light by disposing fluorescent substance either on the light emission portion or under the light emission portion, in other words, on the semiconductor layer 67 and the light emission portion electrode 60 or under the substrate 66.

A section view and a circuit diagram of a semiconductor device to which the bipolar transistor according to the present invention is applied for driving a light emission device are shown in FIGS. 7(A) and 7(B). Reference symbols a, b and c in the section view of FIG. 7(A) correspond to reference symbols a, b and c in the circuit diagram of FIG. 7(B). In this device, a transistor is formed of a base 71, an emitter 72, a collector 73, a base electrode 74, a collector electrode 76 and a base 77. Furthermore, a semiconductor layer 78 is formed on a region of the emitter 72, whereby the emitter 72 and the semiconductor layer 78 form a light emission portion. In addition, a light emission portion electrode 79 is formed on the semiconductor layer 78. When an n-type semiconductor is used as the emitter 72, a p-type semiconductor is used for the semiconductor layer 78. On the other hand, when a p-type semiconductor is used as the emitter 72, an n-type semiconductor is used for the semiconductor layer 78.

The light emission portion is enabled to perform a plane light emission in the upward direction in FIG. 7(A) by using a transparent semiconductor material identical to that of the base 71 for the semiconductor layer 78 and a transparent electrode material for the light emission portion electrode 79. Moreover, by using a transparent material for the substrate 77, the light emission portion is enabled to perform a plane light emission in the downward direction in FIG. 7(A). If a light emission zone is equal to an ultraviolet zone, a light emitted from the light emission portion can be converted into a visible light by disposing a fluorescent substrate on the light emission portion or under the light emission portion, in other words, on the semiconductor layer 78 and the light emission portion electrode 79 or under the substrate 77.

It should be noted that the transistors of the first to third embodiments can be combined with each other for use in driving by forming a light emission portion. Moreover, in the foregoing descriptions, a region continuous with the source or the drain (the collector or the emitter) is used in a part of the light emission portion. In addition to this, a different semiconductor region continuous with the source or the drain (the collector or the emitter) is formed, and this region may be used as a part of the light emission portion. Moreover, the light emission portion may be a light-emitting diode or a laser diode, and a proper light emission device can be formed. Moreover, when the present invention is applied, a semiconductor device, which is entirely transparent, can be fabricated by driving a transparent ZnO light emission device by the use of the transparent transistor. The light emission device can also be made to be partially transparent.

As the light emission portion, proper structures such as a multilayered reflection film, a double hetero structure and a plane light emission structure are adopted, and they can be combined with each other. Moreover, a plurality of the light emission portions and the transistors are arranged in a matrix fashion, and each of the light emission portions is driven by the transparent transistor, whereby the light emission portion can be applied to a display, an illumination panel, a partial light adjusting panel or the like suitably.

(5) Application to Memory

A section view and a circuit diagram of a device in which the FET according to the present invention is applied to a control of a memory device are shown in FIGS. 8(A) and 8(B). Reference symbols a, b and c of FIG. 8(A) correspond to reference symbols a, b and c of FIG. 8(B). In this device, a transistor is formed of a channel layer 81, a source 82, a drain 83, a gate 84, a gate insulating layer 85 and a substrate 86. On the source 82, formed is a conductive layer 88 made of a transparent conductive material identical to that of the source 82. Furthermore, on a region of the drain 83, formed is a semiconductor layer or a conductive layer 87 with the gate insulating layer 85 interposed therebetween, and thus these constituent components form a capacitor. Herein, though the gate insulating layer 85 is used as an inter-electrode insulator of the capacitor, a different insulating layer from this gate insulating layer 85 may be formed to be used. Furthermore, as an electrode of the capacitor, a region continuous to the source or the drain may be used, or alternatively another semiconductor region or another conductive region, which is connected to the source or the drain, may be used. An electrode material forming the capacitor may be a transparent material or an untransparent material, and the transparent material may be partially used for the electrode material of the capacitor. By properly using the transparent material for these layers and these regions, it is possible to fabricate a memory device which is entirely transparent or partially transparent.

Also when the bipolar transistor according to the present invention is used, the application to the memory device is possible by forming a capacitor on the substrate properly. Specifically, for example, in the bipolar transistor as in the foregoing embodiments, a capacitor can be formed of a region continuous to the collector or the emitter or a region of another semiconductor or another conductor connected to the collector or the emitter, the insulating layer on this region, and the semiconductor layer or the conductive layer on the insulating layer.

When the bipolar transistor is applied to the memory device, the memory device can be realized by arranging the transistors and the capacitors in a matrix fashion and by driving the capacitors by the corresponding transistors.

(6) Characteristics

An example of the characteristic view of the transistor according to the present invention is shown in FIG. 9. FIG. 9 shows an example of a change in a drain current (axis of ordinates) with regard to the FET using ZnO for the channel layer when a drain current (axis of abscissa) is changed in the first embodiment of the present invention. Herein, a thickness of the ZnO channel layer was set to 200 nm, a thickness of the gate insulating layer was set to 100 nm, a gate length was set to 600 μm, and a gate width was set to 200 μm. A gate voltage $V_G$ was set to 0 V and a range from –0V to –8V.

(7) Other Applications

The transistor of the present invention can be fabricated on the same substrate together with the light emission device, the capacitor and other devices. Moreover, the same kind of transistor or different kinds of transistors of the present invention are formed, and transparent materials can be used for wiring between the transistors. The transistors and the devices driven by these transistors can be formed so as to be entirely or partially transparent properly. Moreover, a size, a thickness and a dimension of the transistor can be properly set in accordance with purposes, processes or the like. A doping amount can be properly set in accordance with manufacturing processes, device performance or the like according to demand.

Furthermore, as a transparent n-type semiconductor, a transparent n-type semiconductor, a transparent conductive material and a transparent insulating material, the example in which elements are doped on the basis of the ZnO semiconductor was described. However, the present invention is not limited to this. For example, besides zinc oxide ZnO, elements may be doped on the basis of a transparent material such as zinc magnesium oxide $Mg_xZn_{1-x}O$, zinc cadmium oxide $Cd_xZn_{1-x}O$, cadmium oxide CdO or the like properly.

Besides the foregoing ways, it is possible to realize a semiconductor device which is entirely or partially transparent by applying to a transistor performing signal processing by driving a detector for detecting light ranging from ultraviolet zone to X-ray zone, to an oxygen sensor, and to a device obtained by combining a sound wave, Surface Acoustic Wave (SAW) or piezoelectric property. Moreover, the present invention enables an electronic circuit to attach on a window glass of a car, a house or the like, a transparent plastic board or the like. The present invention can manufacture computer peripheral equipment for example, a keyboard, a touch panel and a pointing device so as to be transparent. By being transparent, they can be manufactured confidentially, or they can be manufactured so as to be hard to look from some other place. Moreover, it is possible to propose something original in terms of design. In addition to these, an application range of the present invention is very wide.

INDUSTRIAL APPLICABILITY

The present invention can provide the transistor using the transparent channel layer made of zinc oxide or the like, which is entirely or partially transparent. Specifically, according to the present invention, by using the transparent material such as zinc oxide or the like for the channel layer (conductive layer), the transistor can be provided, which offers no light sensitivity within the visible light region, thus removing a necessity to form the light shielding layer, and increases the area rate of the display portion of the liquid crystal display device or the like.

Furthermore, according to the present invention, the transparent transistor can be used for various kinds of applications in an optical device field for use in driving a light emission device such as a plane light emission laser and an electroluminescence device and for use in a memory. Still furthermore, according to the present invention, the semiconductor device can be provided, which is used as a transparent electronic device for various kinds of wide applications in addition to a driving circuit requiring no light shielding layer.

What is claimed is:

1. A transistor, comprising:
   an emitter, a collector and a base selected from the group consisting of:
   (a) an emitter and a collector made of a transparent n-type semiconductor, and a base made of a transparent p-type semi conductor, and
   (b) a base made of a transparent n-type semiconductor, and an emitter and a collector made of a transparent p-type semiconductor,
   said n-type semiconductor comprising any one of zinc oxide ZnO, zinc magnesium oxide $Mg_xZn_{1-x}O$, zinc cadmium oxide $Cd_xZn_{1-x}O$ and cadmium oxide CdO, doped with group III elements or group VII elements, and
   said transparent p-type semiconductor comprising any one of zinc oxide ZnO, zinc magnesium oxide $Mg_xZn_{1-x}O$, zinc cadmium oxide $Cd_xZn_{1-x}O$ and cadmium oxide CdO, doped with group I elements or group V elements; and
   a base electrode, an emitter electrode and a collector electrode, in which
   (1) a transparent conductive material doped or undoped with any one of group III elements, group VII elements and group I elements,
   (2) a transparent conductor, or
   (3) an untransparent electrode material
   are used partially or entirely, the base electrode, the emitter electrode and the collector electrode being respectively formed on said base, said emitter and said collector.

2. A semiconductor device, comprising:
   the transistor according to claim 1; and
   a light emission portion formed of a region continuous to said collector or said emitter of said transistor or a region of another semiconductor connected to said collector or said emitter, and a semiconductor layer joined to said region.

3. A semiconductor device, comprising:
   the transistor according to claim 1, and a capacitor formed of a region continuous to said collector and said emitter of said transistor or a region of another semiconductor or a conductor connected to said collector or said emitter, an insulating layer on said region, and a semiconductor layer or a conductive layer on said insulating layer.

4. A semiconductor device, wherein a plurality of the semiconductor devices according to claim 3 are arranged in a matrix shape, and a capacitor or a light emission portion is driven by each transistor.

5. A semiconductor device, comprising a plurality of transistors according to claim 1, and an insulating layer, said insulating layer is between transistors of said plurality of transistors;
   wherein said insulating layer comprises a transparent insulating material including at least one of insulative ZnO doped with elements capable of taking a valence of one as a valence number or group V elements, a transparent insulating oxide, and a transparent insulator.

6. A semiconductor device, comprising:
   a plurality of transistors according to claim 1; and
   wiring between said plurality of transistors,
   wherein said wiring comprises a transparent conductive material including at least one of conductive ZnO doped or undoped with group III elements, group VII elements, group I elements and group V elements, a transparent conductor comprising at least one of $In_2O_3$, $SnO_2$ and , $(In-Sn)O_x$, or a un-transparent electrode material.

7. A semiconductor device, comprising:
   the transistor according to claim 1; and
   an inductor comprising a transparent conductive material, said transparent conductive material comprising at least one of conductive ZnO doped or undoped with group III elements, group VII elements, group I elements and group V elements, and a transparent conductor comprising at least one of $In_2O_3$, $SnO_2$ and $(In-Sn)O_x$.

8. A semiconductor device, wherein a plurality of the semiconductor devices according to claim 2 are arranged in a matrix shape, and a capacitor or a light emission portion is driven by each transistor.

9. The transistor of claim 1, wherein said transparent n-type semiconductor includes at least conductive ZnO doped with group III elements or group VII elements.

10. The transistor of claim 1, wherein said transparent p-type semiconductor includes at least conductive ZnO doped with group I elements or group V elements.

11. The transistor of claim 1, wherein said transparent conductive material includes at least one conductive ZnO undoped and conductive ZnO doped with at least one of group III elements, group VII elements, and group I elements.

12. The transistor of claim 1, wherein said transparent conductive material includes at least one of $In_2O_3$, $SnO_2$ and $(In—Sn)O_x$.

13. The transistor of claim 1, wherein said base is made of a transparent n-type semi conductor.

14. The transistor of claim 1, wherein said base is made of a transparent p-type semi conductor.

15. A method of making a transistor, comprising:
  depositing an emitter, a collector, and a base, wherein said emitter, said collector and said base are selected from the group consisting of:
    (a) an emitter and a collector made of a transparent n-type semiconductor, and a base made of a transparent p-type semiconductor, and
    (b) a base made of a transparent n-type semiconductor, and an emitter and a collector made of a transparent p-type semiconductor,
    said n-type semiconductor comprising any one of ZnO, zinc magnesium oxide $Mg_xZn_{1-x}O$, zinc cadmium oxide $Cd_xZn_{1-x}O$, and cadmium oxide CdO, and said n-type semiconductor is doped with group III elements or group VII elements;
  depositing a base, an emitter and a collector, wherein said base, or said emitter and said collector are made of a transparent p-type semiconductor comprising at least one of ZnO, zinc magnesium oxide $Mg_xZn_{1-x}O$, zinc cadmium oxide $Cd_xZn_{1-x}O$, and cadmium oxide CdO, said p-type semiconductor doped with group I elements or group V elements; and
  depositing a base electrode, an emitter electrode and a collector electrode, wherein said base electrode, said emitter electrode and said collector electrode comprise a transparent conductive material comprising conductive ZnO doped or undoped with any one of group III elements, group VII elements and group I elements, or a transparent conductive material comprising at least one of $In_2O_3$, $SnO_2$ and $(In—Sn)O_x$, or an untransparent electrode material and
  wherein said base electrode, said emitter electrode and said collector electrode are respectively formed on said base, said emitter, and said collector.

16. The method of claim 15, wherein said transparent n-type semiconductor includes at least conductive ZnO doped with group III elements or group VII elements.

17. The method of claim 15, wherein said transparent p-type semiconductor includes at least conductive ZnO doped with group I elements or group V elements.

18. The method of claim 15, wherein said transparent conductive material includes at least one of conductive ZnO undoped and conductive ZnO doped with any one of group III elements, group VII elements and group I elements.

19. The method of claim 15, wherein said transparent conductive material includes at least one of $In_2O_3$, $SnO_2$ and $(In—Sn)O_x$.

20. The method of claim 15, wherein said base is made of a transparent n-type semiconductor.

21. The method of claim 15, wherein said base is made of a transparent p-type semiconductor.

22. A method of making a transistor, comprising:
  providing an emitter and a collector, or a base, wherein said emitter, said collector and said base are selected from the group consisting of:
    (a) an emitter and a collector made of a transparent n-type semiconductor, and a base made of a transparent p-type semiconductor, and
    (b) a base made of a transparent n-type semiconductor, and an emitter and a collector made of a transparent p-type semiconductor,
    said n-type semiconductor comprising at least one of ZnO, zinc magnesium oxide $Mg_xZn_{1-x}O$, zinc cadmium oxide $Cd_xZn_{1-x}O$, and cadmium oxide CdO, and said n-type semiconductor is doped with at least one of group III elements and group VII elements;
  providing a base, or an emitter and a collector, wherein said base, or said emitter and said collector are made of a transparent p-type semiconductor comprising at least one of zinc oxide ZnO, zinc magnesium oxide $Mg_xZn_{1-x}O$, zinc cadmium oxide $Cd_xZn_{1-x}O$, and cadmium oxide CdO, and said p-type semiconductor is doped at least one of with group I elements and group V elements; and
  providing a base electrode, an emitter electrode, and a collector electrode;
  wherein said base electrode, said emitter electrode, and said collector electrode respectively are formed on said base, said emitter, and said collector;
  wherein said base electrode, said emitter electrode, and said collector electrode comprise:
    (1) a transparent conductive material comprising conductive ZnO that is undoped and conductive ZnO that is doped with at least one of group III elements, group VII elements, and group I elements; or
    (2) a transparent conductor comprising at least one of $In_2O_3$, $SnO_2$ and $(In—Sn)O_x$; or
    (3) an un-transparent electrode material.

23. A method of using a transistor, said transistor comprising:
  an emitter and a collector, or a base, wherein said emitter, said collector and said base are selected from the group consisting of:
    (a) an emitter and a collector made of a transparent n-type semiconductor, and a base made of a transparent p-type semiconductor, and
    (b) a base made of a transparent n-type semiconductor, and an emitter and a collector made of a transparent p-type semiconductor,
    said n-type semiconductor comprising any one of zinc oxide ZnO, zinc magnesium oxide $Mg_xZn_{1-x}O$, zinc cadmium oxide $Cd_xZn_{1-x}O$, and cadmium oxide CdO, and said n-type semiconductor is doped with at least one of group III elements and group VII elements; or
  a base, or an emitter and a collector, wherein said base, or said emitter and said collector are made of a transparent p-type semiconductor comprising any one of zinc oxide ZnO, zinc magnesium oxide $Mg_xZn_{1-x}O$, zinc cadmium oxide $Cd_xZn_{1-x}O$, and cadmium oxide CdO, and said p-type semiconductor is doped with at least one of group I elements and group V elements;

a base electrode, an emitter electrode, and a collector electrode; wherein said base electrode, said emitter electrode, and the collector electrode are respectively formed on said base, said emitter, and said collector;

wherein said base electrode, said emitter electrode, and said collector electrode comprise:

(1) a transparent conductive material comprising one of conductive ZnO that is undoped and conductive ZnO that is doped with at least one of group III elements, group VII elements, and group I elements; or (2) a transparent conductor comprising at least one of $In_2O_3$, $SnO_2$ and $(In-Sn)O_x$, or (3) an un-transparent electrode material; and said method comprising applying a voltage across at least one electrode of said transistor.

24. A transistor, comprising:

an emitter, a collector and a base made of a transparent n-type semiconductor selected from the group consisting of:
  (a) an emitter and a collector made of a transparent n-type semiconductor, and a base made of a transparent p-type semiconductor, and
  (b) a base made of a transparent n-type semiconductor, and an emitter and a collector made of a transparent p-type semiconductor, said transparent n-type semiconductor comprising at least one of zinc oxide ZnO, zinc magnesium oxide $Mg_xZn_{1-x}O$, zinc cadmium oxide $Cd_xZn_{1-x}O$, and cadmium oxide CdO, and said transparent n-type semiconductor is doped with at least one of group III elements and group VII elements;

a base, or an emitter and a collector made of a transparent p-type semiconductor, said transparent p-type semiconductor comprising any one of zinc oxide ZnO, zinc magnesium oxide $Mg_xZn_{1-x}O$, zinc cadmium oxide $Cd_xZn_{1-x}O$, and cadmium oxide CdO, and said transparent p-type semiconductor is doped with at least one of group I elements and group V elements; and a base electrode, an emitter electrode, and a collector electrode;

wherein said base electrode, said emitter electrode, and said collector electrode are respectively formed on said base, said emitter, and said collector; and wherein said base electrode, said emitter electrode, and said collector electrode comprise:

(1) a transparent conductive material comprising one of conductive ZnO that is un-doped and conductive ZnO that is doped with at least one of group III elements, group VII elements, and group I elements; or (2) a transparent conductor comprising at least one of $In_2O_3$, $SnO_2$, and $(In-Sn)O_x$, or (3) an un-transparent electrode material.

* * * * *

UNITED STATES PATENT AND TRADEMARK OFFICE
CERTIFICATE OF CORRECTION

PATENT NO.         : 7,064,346 B2
APPLICATION NO. : 10/765901
DATED                  : June 20, 2006
INVENTOR(S)        : Kawasaki et al.

It is certified that error appears in the above-identified patent and that said Letters Patent is hereby corrected as shown below:

Column 10 line 2 reading: "$Mg_xZn_{1-x} O$," should read:

-- $Mg_xZn_{1-x}O$, --

Column 10 line 3 reading: "$Cd_x Zn_{1-x} O$" should read:

-- $Cd_xZn_{1-x}O$ --

Column 10 lines 7-8 reading: "$Mg_x Zn_{1-x} O$," should read:

-- $Mg_xZn_{1-x}O$, --

Column 10 line 8 reading: "$Cd_x Zn_{1-x} O$" should read:

-- $Cd_xZn_{1-x}O$ --

Column 10 line 58 reading: "and , (" should read:

-- and ( --

Column 10 line 58 reading: "$(In—Sn)O_x$," should read:

-- $(In-Sn)O_x$, --

Column 10 line 67 reading: "$(In—Sn)O_x$." should read:

-- $(In-Sn)O_x$. --

Column 11 line 18 reading: "$(In—Sn)O_x$." should read:

-- $(In-Sn)O_x$. --

Column 11 line 20 reading: "semi conductor" should read:

-- semiconductor --

Column 11 line 22 reading: "semi conductor" should read:

-- semiconductor --

UNITED STATES PATENT AND TRADEMARK OFFICE
CERTIFICATE OF CORRECTION

PATENT NO.       : 7,064,346 B2
APPLICATION NO.  : 10/765901
DATED            : June 20, 2006
INVENTOR(S)      : Kawasaki et al.

It is certified that error appears in the above-identified patent and that said Letters Patent is hereby corrected as shown below:

Column 11 line 34 reading: "$Mg_x\ Zn_{1-x}\ O,$" should read:

-- $Mg_xZn_{1-x}O,$ --

Column 11 line 52 reading: "(In—Sn)" should read:

-- (In-Sn) --

Column 11 line 52 reading: "$O_x,$or" should read:

-- $O_x,$ or --

Column 12 line 3 reading: "$(In—Sn)O_x.$" should read:

-- $(In-Sn)O_x.$ --

Column 12 line 44 reading: "$SnO_2$and" should read:

-- $SnO_2$ and --

Column 12 line 44 reading: "$(In—Sn)O_x;$" should read:

-- $(In-Sn)O_x;$ --

Column 13 line 14 reading: "(In—Sn)" should read:

-- (In-Sn) --

Column 13 line 14 reading: "$O_x,$or" should read:

-- $O_x,$ or --

Column 14 line 25 reading: "$SnO_2,$ and" should read:

-- $SnO_2$ and --

Column 14 line 25 reading: "(In—Sn)" should read:

-- (In-Sn) --

UNITED STATES PATENT AND TRADEMARK OFFICE
CERTIFICATE OF CORRECTION

PATENT NO. : 7,064,346 B2  Page 3 of 3
APPLICATION NO. : 10/765901
DATED : June 20, 2006
INVENTOR(S) : Kawasaki et al.

It is certified that error appears in the above-identified patent and that said Letters Patent is hereby corrected as shown below:

Column 14 line 25 reading: "$O_x$, or" should read:

-- $O_x$; or --

Signed and Sealed this

Seventeenth Day of October, 2006

JON W. DUDAS
*Director of the United States Patent and Trademark Office*